(12) United States Patent
Dichler et al.

(10) Patent No.: US 11,942,774 B2
(45) Date of Patent: Mar. 26, 2024

(54) ARC FAULT DETECTOR

(71) Applicant: Eaton Intelligent Power Limited, Dublin (IE)

(72) Inventors: Werner Dichler, Grossschoenau (AT); Guenter Martinek, Vienna (AT)

(73) Assignee: EATON INTELLIGENT POWER LIMITED, Dublin (IE)

( * ) Notice: Subject to any disclaimer, the term of this patent is extended or adjusted under 35 U.S.C. 154(b) by 243 days.

(21) Appl. No.: 17/604,773

(22) PCT Filed: Apr. 23, 2020

(86) PCT No.: PCT/EP2020/061352
§ 371 (c)(1),
(2) Date: Oct. 19, 2021

(87) PCT Pub. No.: WO2020/216853
PCT Pub. Date: Oct. 29, 2020

(65) Prior Publication Data
US 2022/0181864 A1 Jun. 9, 2022

(30) Foreign Application Priority Data

Apr. 25, 2019 (GB) ...................... 1905751

(51) Int. Cl.
*G01R 31/52* (2020.01)
*G01R 31/14* (2006.01)
*H02H 1/00* (2006.01)

(52) U.S. Cl.
CPC ........... *H02H 1/0015* (2013.01); *G01R 31/14* (2013.01); *G01R 31/52* (2020.01)

(58) Field of Classification Search
CPC ...... H02H 1/0015; G01R 31/14; G01R 31/52; G01R 31/1272; G01R 31/12; G01R 31/50
(Continued)

(56) References Cited

U.S. PATENT DOCUMENTS 4,639,817 A * 1/1987 Cooper ............... H02H 1/0015
361/88
5,434,509 A 7/1995 Blades
(Continued)

FOREIGN PATENT DOCUMENTS

EP 3214453 A1 9/2017

*Primary Examiner* — Christopher P Mcandrew
(74) *Attorney, Agent, or Firm* — LEYDIG, VOIT & MAYER, LTD.

(57) ABSTRACT

An arc fault detector includes slew-rate-detection, envelope-step-detection, and first and second controller units. The slew-rate-detection-unit determines a slew rate of the electric current in the first electric line, comparing the slew rate with a threshold, and outputting a slew-rate-detection-signal on a second output when the determined slew rate is higher than the threshold. The envelope-step-detection-unit determines change of an envelope-value of a predefined frequency band of the broadband measurement signal within a predefined timespan, and outputs an envelope-step-detection-signal on a third output when the change is higher than a threshold change. The first controller-unit, connected to second and third outputs, outputs a second arc-detection-signal on a fourth output when it receives slew-rate and frequency-detection signals within a first detection-window. The second controller-unit, connected to first and fourth outputs, outputs a trigger signal when it receives first and second arc-detection-signals for at least a defined total time within a second detection-window.

9 Claims, 2 Drawing Sheets

(58) Field of Classification Search
USPC .......................................................... 324/500
See application file for complete search history.

(56) References Cited

U.S. PATENT DOCUMENTS

| | | | |
|---|---|---|---|
| 6,377,427 B1 | 4/2002 | Haun et al. | |
| 2007/0242399 A1 | 10/2007 | Carton et al. | |
| 2010/0123983 A1* | 5/2010 | Elms | H02H 1/0015 361/45 |
| 2011/0299201 A1* | 12/2011 | Rozman | H02H 1/0015 361/42 |
| 2012/0098672 A1* | 4/2012 | Restrepo | H02H 1/0015 340/815.45 |
| 2014/0091060 A1* | 4/2014 | Henke | G01R 31/50 218/8 |
| 2014/0168843 A1* | 6/2014 | Privitera | G01R 31/50 702/58 |
| 2019/0383872 A1* | 12/2019 | Andle | G01R 31/12 |

* cited by examiner

ARC FAULT DETECTOR

CROSS-REFERENCE TO PRIOR APPLICATIONS

This application is a U.S. National Phase application under 35 U.S.C. § 371 of International Application No. PCT/EP2020/061352, filed on Apr. 23, 2020, and claims benefit to British Patent Application No. GB 1905751.2, filed on Apr. 25, 2019. The International Application was published in English on Oct. 29, 2020 as WO 2020/216853 under PCT Article 21(2).

FIELD

The present disclosure relates to an arc fault detector.

BACKGROUND

Electric arcs cause high frequency noise on an electric line or in an electric circuit. Arc fault detectors observe electric lines by measuring the electric current or voltage. Arc fault detectors may detect an arc by analyzing the frequency behavior of the electric current or voltage regarding specific patterns, which are called arc pattern.

The present inventors have recognized that it is a drawback of such arc detectors, that they tend to nuisance tripping in environments with high frequency noise. High frequency signals interferences do not necessarily differ from high frequency signals generated by an arc. False tripping cause an unnecessary shut down of an electric environment.

There are already a lot of different methods for arc fault detection known, each claiming a reduction of nuisance tripping. The present inventors have recognized that such methods are often much too complex and require too many resources for an implementation in safety switchgear for mass production.

SUMMARY

In an embodiment, the present invention provides an arc fault detector with a first electric line and at least a first sensor adapted for monitoring an electric current and/or voltage spectrum in the first electric line and outputting a broadband measurement signal, and a signal-pattern-analyzing-unit adapted to compare the broadband measurement signal with at least a first predefined arc pattern, and to output a first arc-detection-signal on a first output in case the broadband measurement signal matches the arc pattern. The arc fault detector further includes a slew-rate-detection-unit, an envelope-step-detection-unit, a first controller-unit, and a second controller-unit. The slew-rate-detection-unit is adapted to determine a slew rate of the electric current in the first electric line, compare the determined slew rate with a threshold slew rate, and output a slew-rate-detection-signal on a second output in case the determined slew rate is higher than the threshold slew rate. The envelope-step-detection-unit is adapted to determine a change of an envelope-value of at least a predefined frequency band of the broadband measurement signal within a predefined timespan. The envelope-step-detection-unit is also adapted to output an envelope-step-detection-signal on a third output in case that the determined change is higher than a threshold change. The first controller-unit is connected to the second output and the third output. The first controller-unit is adapted to output a second arc-detection-signal on a fourth output in case the first controller-unit receives the slew-rate detection signal and the frequency-detection-signal within a first predefined detection-time-window. The second controller-unit is connected to the first output and the fourth output. The second controller-unit is adapted to output a trigger signal on a trigger output in case the second controller-unit receives the first arc-detection-signal and the second arc-detection-signal for at least a defined total time within a second predefined detection-time-window.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Embodiments of the present invention overcome the drawbacks of the state of the art by providing an arc fault detector that can be implemented easily, which requires only simple technical components, and which has a high capability in detecting arcs, and a low tendency for nuisance tripping.

As a result, the arc fault detector of the present invention can be implemented with simple technical components. This arc fault detector has a high capability in detecting arcs and a low tendency for nuisance tripping. The arc fault detector combines the detection of two typical arc behaviors, the high slew rate at the moment of the beginning of the arc, and a high frequency behavior. These two behaviors are further combined with well-known arc pattern detection, helping to avoid typical false arc-detection situations of them.

The actual arc fault detector combines the results of three different detectors in a specific manner to reduce nuisance tripping and to provide save arc detection.

Figure 1:
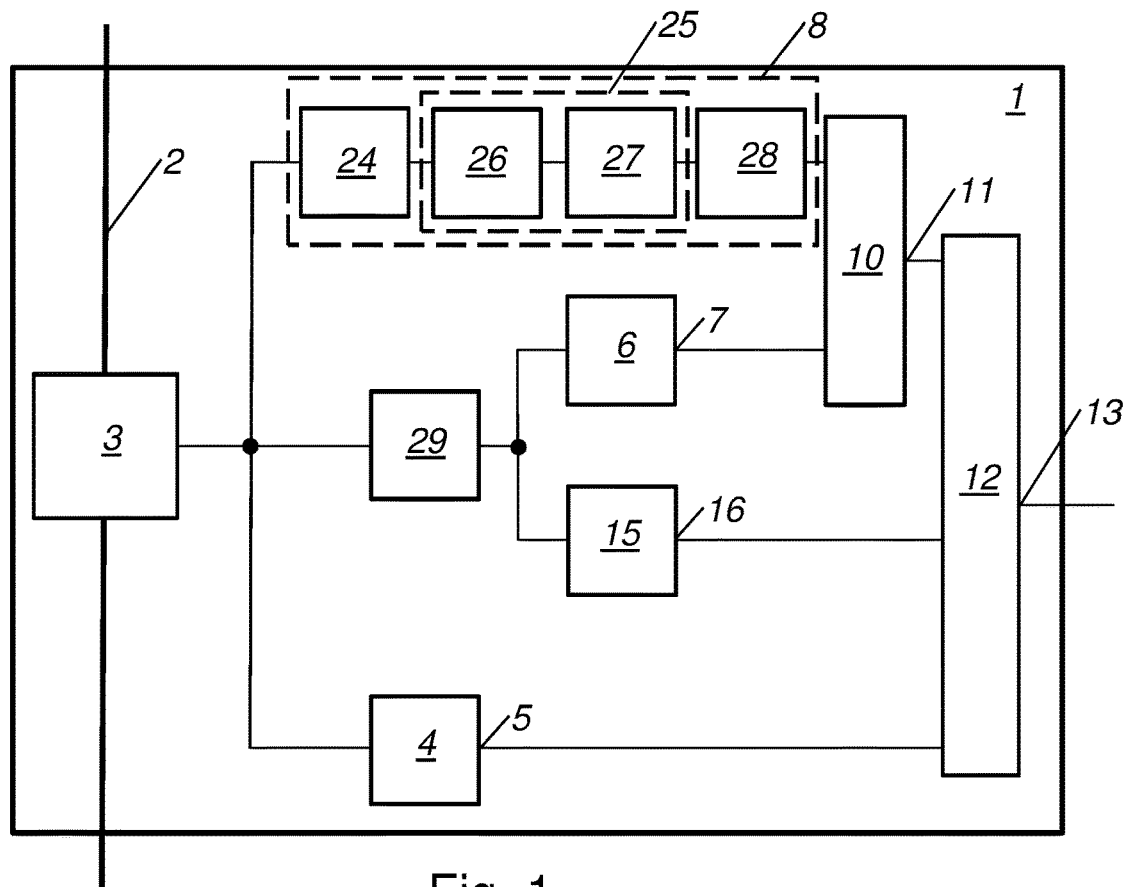
FIG. 1 shows a block diagram of a first preferred embodiment of an arc fault detector according to the invention.
Figure 3:
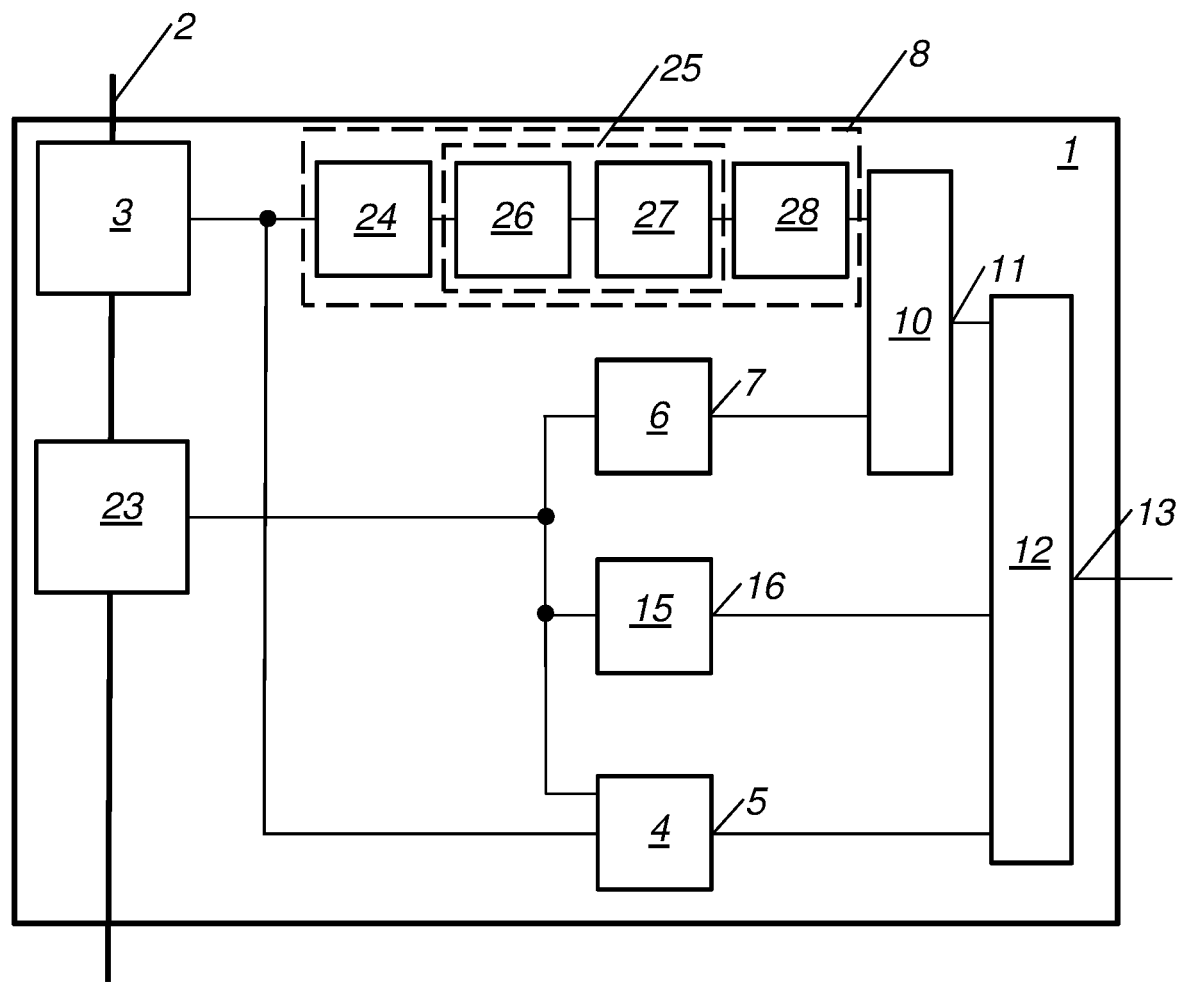
FIG. 3 shows a block diagram of a second preferred embodiment of an arc fault detector according to the invention.

FIGS. 1 and 3 show preferred embodiments of an arc fault detector 1 with a first electric line 2 and at least a first sensor 3 adapted for monitoring an electric current and/or voltage spectrum in the first electric line 2 and outputting a broadband measurement signal, further comprising a signal-pattern-analyzing-unit 4 adapted to compare the broadband measurement signal with at least a first predefined arc pattern, and to output a first arc-detection-signal on a first output 5 in case the broadband measurement signal matches the arc pattern.

The arc fault detector 1 further comprises:
  a slew-rate-detection-unit 6 adapted to determine a slew rate of the electric current in the first electric line 2, comparing the determined slew rate with a threshold slew rate, and outputting a slew-rate-detection-signal on a second output 7 in case the determined slew rate is higher than the threshold slew rate,
  an envelope-step-detection-unit 8 adapted to determine a change of an envelope-value of at least a predefined frequency band of the broadband measurement signal within a predefined timespan, the envelope-step-detection-unit 8 being further adapted to output an envelope-step-detection-signal on a third output 9 in case that the determined change is higher than a threshold change, a first controller-unit 10 connected to the second output 7 and the third output 9, the first controller-unit 10 being adapted to output a second arc-detection-signal on a fourth output 11 of the first controller-unit 10 in case the first controller-unit 10 receives the slew-rate detection signal and the frequency-detection-signal within a first predefined detection-time-window, a second controller-unit 12 connected to the first output 5 and the fourth output 11, the second controller-unit 12 being adapted to output a trigger signal on a trigger output 13 in case the second controller-unit 12 receives the first arc-detection-signal and the second arc-detection-signal for at least a defined total time within a second predefined detection-time-window.

As a result, the arc fault detector 1 of the present invention can be implemented with simple technical components. This arc fault detector 1 has a high capability in detecting arcs and a low tendency for nuisance tripping. The arc fault detector 1 combines the detection of two typical arc behaviors, the high slew rate at the moment of the beginning of the arc, and a high frequency behavior. These two behaviors are further combined with well-known arc pattern detection, helping to avoid typical false arc-detection situations of them.

The actual arc fault detector 1 combines the results of three different detectors in a specific manner to reduce nuisance tripping and to provide save arc detection.

In the example described, the arc fault detector 1 contains a first electric line 2. Alternatively, the arc fault detector 1 contains also a second electric line 14 and can contain a number of further electric lines.

The arc fault detector 1 can be a stand-alone component, comprising a casing and clamps for connecting the electric lines 2, 14.

Figure 2:
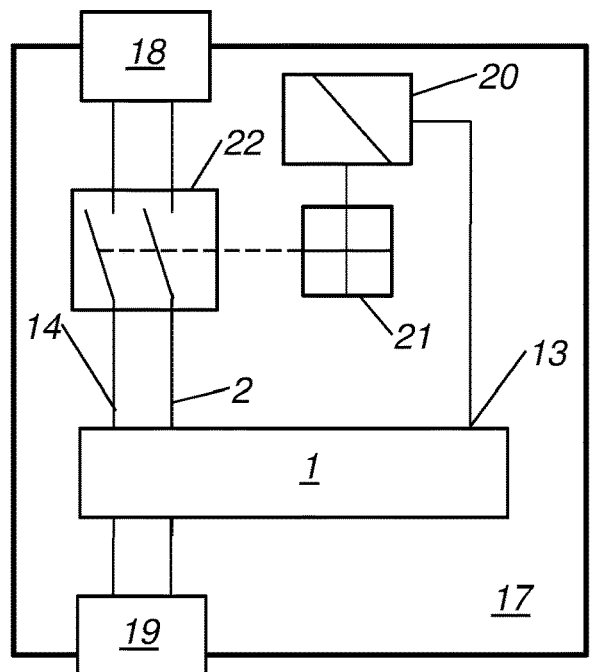
FIG. 2 shows an arc fault circuit breaker with an arc fault detector according to the invention.

In the example described and according FIG. 2, the arc fault detector 1 is an integral part of an arc fault circuit breaker 17. The trigger output 13 of the arc fault detector 1 is connected to an actuator 20 and/or a switching mechanism 21 of the arc fault circuit breaker 17, and the switching mechanism 21 is connected to at least one pair of switching contacts 22 arranged in the first electric line 2 and the further preferred second electric line 14. The arc fault circuit breaker 17 further comprising a first clamps 18 and second clamps 19.

Alternatively the arc fault circuit breaker 17 can be implemented as a hybrid circuit breaker or a solid state circuit breaker.

As indicated earlier, the arc fault detector 1 comprises the first current and/or voltage sensor 3 which monitors the electric current in the first electric line 2. Preferably, the arc fault detector 1 comprises one current and/or voltage sensor 3 for each electric line 2, 14. According the second embodiment as shown in FIG. 3 the arc fault detector 1 further comprises a second sensor 23, which is embodied as current sensor 23.

The first sensor 3 can be of any type of current and/or voltage sensor 3 which has a high or broad bandwidth. That means that the sensor 3 shall not monitor an electric signal only at a single frequency but over a broad spectrum of frequencies, especially containing high frequencies. The current sensor 3 outputs a broadband measurement signal.

In the context of this embodiment, broadband means that the current and/or voltage sensor 3 is adapted to output the broadband measurement signal with a bandwidth from at least 10 Hz to 10 MHz. The bandwidth can even be broader. In another example, the current and/or voltage sensor 3 is adapted to output the broadband measurement signal with a bandwidth from 1 Hz to 20 MHz. It is not necessary that the first sensor 3 is linear over the whole bandwidth.

Typical for the initial phase of an electric arc are a high rise of the current in short time together with the coming up of high frequency components. But these two phenomena are not sufficient for detecting an electric arc.

The current and/or voltage in the electric line 2 are evaluated in parallel in at least three different units 4, 6, 8.

Preferably the broadband measurement signal is a digital signal. In case of an analogous current and/or voltage sensor 3 the broadband measurement signal is A/D-converted.

The output of the current and/or voltage sensor 3 is connected to a signal-pattern-analyzing-unit 4. The signal-pattern-analyzing-unit 4 is adapted to compare the broadband measurement signal with at least a first predefined arc pattern. Units for detecting an electric arc by analyzing the behavior of a measurement signal according specific pattern are well known in the technical field of arc fault detectors. They usually analyze high frequency noise. Such units are searching for specific noise pattern, which should be characterizing for noise generated by an arc. The actual arc fault detector 1 can be implemented with any kind of signal-pattern-analyzing-unit 4. In case the broadband measurement signal matches the arc pattern, the signal-pattern-analyzing-unit 4 generates a first arc-detection-signal, and puts this signal out on the first output 5 of the signal-pattern-analyzing-unit 4. Preferably the first arc-detection-signal is a Boolean signal, indicating the detection of an arc by setting the first arc-detection-signal from logic false to logic true.

According the first preferred embodiment the output of the first current and/or voltage sensor 3 is connected to a slew-rate-detection-unit 6. The slew-rate-detection-unit 6 is adapted to detect the occurrence of a signal with a slew rate higher a definite threshold slew rate. The slew rate is the rate of change of the current. The slew rate is defined as di/dt. The slew-rate-detection-unit 6 determines the slew rate of the incoming broadband measurement signal and compares this with a threshold slew rate. A typical threshold slew rate is in the range of 10.000 A/s.

According the first preferred embodiment as shown in FIG. 1, comprising only the first broadband sensor 3 it is suggested that a low-pass-filter 29 is arranged between the first sensor 3 and the slew-rate-detection-unit 6. The broadband measurement signal contains high frequency components, which can jam the detection accuracy of the slew-rate-detection-unit 6. A typical cutoff frequency of the low-pass-filter 29 is in the range of a few kHz.

According the second preferred embodiment as shown in FIG. 2 the arc fault detector 1 further comprises a second sensor 23 adapted for monitoring the electric current in the first line 2 and outputting a low frequency measurement signal. Low frequency means a cutoff frequency in the range of a few kHz causing a narrow bandwidth. As this measurement signal does not contain high frequency components, a separate low-pass-filter 29 is not necessary and the second sensor 23 is preferably connected to the slew-rate-detection-unit 6 without an additional filter.

In case that the determined slew rate is higher than the threshold slew rate, the slew-rate-detection-unit 6 is outputting a slew-rate-detection-signal on a second output 7 of the slew-rate-detection-unit 6. Preferably the slew-rate-detection-signal is a Boolean signal, indicating the detection of a signal with high slew rate by setting the slew-rate-detection-signal from logic false to logic true.

According a preferred embodiment, the slew-rate-detection-unit 6 is adapted to output the slew-rate-detection-signal for a predefined time. In case a slew rate being high enough for outputting the slew-rate-detection-signal is detected, the slew-rate-detection-signal is not switched off immediately in the same moment, the slew rate falls under the threshold slew rate, but is further outputted.

The predefined time for outputting the slew-rate-detection-signal depends on the specific kind of the envelope-step-detection-unit 8. It is preferred that the slew-rate-detection-unit 6 is adapted to output the slew-rate-detection-signal for a predefined time, especially 1 µs to 500 µs.

The output of the first current and/or voltage sensor 3 is further connected to an envelope-step-detection-unit 8. The envelope-step-detection-unit 8 analyzes the spectrum of the broadband measurement signal regarding the occurrence of a special behavior of higher frequency components. In case an arc occurs the arc will go out or extinguish near the zero crossing points and will reignite if the voltage is high enough during the next half cycle of an AC-voltage. The high rate of change cause broadband noise. The highest amplitude and the highest broadband will occur around the points of outgoing and/or reignition of the arcs. The high rate of change can also be named as a step.

The envelope-step-detection-unit 8 analyses typically only a part respective a narrow frequency band of the broadband measurement signal. A center frequency of the frequency band is typically in the range of 4 MHz to 20 MHz. It is preferred that the envelope-step-detection-unit 8 contains a band-pass-filter 24 arranged at an input of the envelope-step-detection-unit 8. The central frequency of the band-pass-filter 24 is preferably in the range between 5 MHz and 18 MHz. Analyzing only a part of the broadband measurement signal saves resources in the real implementation of the envelope-step-detection-unit 8.

According a special preferred embodiment the envelope-step-detection-unit 8 contains more than one band-pass-filter 24 and is embodied to analyze the broadband measurement signal in more than one low bandwidth frequency band.

Alternatively the first voltage and/or current sensor 3 can be embodied as a sensor outputting a high frequency measurement signal with low bandwidth. As a result it would not be necessary to implement the band-pass-filter 24.

The envelope-step-detection-unit 8 is adapted to determine a change of an envelope-value in the frequency band within a predefined timespan.

It is suggested that the signal within the analyzed frequency band is edited. According the preferred embodiments the envelope-step-detection-unit 8 further comprises an envelope determination unit 25. The envelope determination unit 25 comprises a rectifier unit 26 coupled to the exit of the band-pass-filter 24. The resulting signal contains only positive values.

The exit of the rectifier unit 26 is connected to a unit 27 to detect the maximum values of the rectified signal and further interpolating a curve along the maximum values to build the envelope.

According the preferred embodiments the predefined timespan is infinitesimal. According this feature the envelope-step-detection-unit 8 comprises a unit 28 to differentiate the envelope curve. The igniting and/or the outgoing arcs cause high and easy to detect values after differentiation of the envelope.

The envelope-step-detection-unit 8 is further adapted to output an envelope-step-detection-signal on a third output in case that the determined change is higher than a threshold change. Preferably the envelope-step-detection-signal is a Boolean signal.

The second output 7 of the slew-rate-detection-unit 6 and the third output of the envelope-step-detection-unit 8 are connected to a first controller-unit 10. The first controller-unit 10 is adapted to output a second arc-detection-signal on a fourth output 11 in case the first controller-unit 10 receives the slew-rate detection signal and the envelope-step-detection-signal within a first predefined detection-time-window. This means, that both conditions: high slew rate and high change of the value of the envelope have to occur almost at the same time. Corresponding to this, the slew-rate-detection-signal and the envelope-step-detection-signal have to be received by the first controller-unit 10 almost at the same time. The first predefined detection-time-window is typically shorter than the duration of one half wave of the fundamental frequency of the protected electric network. For a 50 Hz network the first predefined detection-time-window typically is in the range of 100 µs to 1 ms.

Preferably the second arc-detection-signal is a Boolean signal, indicating that a high slew rate and a high change of the value of the envelope are detected almost at the same time by setting the second arc-detection-signal from logic false to logic true.

According to a preferred embodiment, the first controller-unit 10 is adapted to output the second arc-detection-signal for a predefined time. In case a high slew rate and a high change of the value of the envelope are detected at almost the same time, the second arc-detection-signal is not switched off immediately (in the same moment) if one of the conditions isn't met, but it is further outputted. Holding the second arc-detection-signal on logic true for a longer time enables the signal-pattern-analyzing-unit 4 to analyze the broadband measurement signal in a more detailed way.

The predefined time for outputting the second arc-detection-signal depends on the specific kind of the signal-pattern-analyzing-unit 4 and the fundamental frequency of the protected electric network. It is preferred that this time is in the range of the duration of one half wave of the fundamental frequency up to the duration of three half waves. For a fundamental frequency of 50 Hz the predefined time is especially in the range from 10 ms to 60 ms.

The first output 5 of the signal-pattern-analyzing-unit 4 and the fourth output 11 of the first controller unit 10 are connected to inputs of a second controller-unit 12. The second controller-unit 12 is adapted to output a trigger signal on a trigger output 13 in case the second controller-unit 12 receives the first arc-detection-signal and the second arc-detection-signal for at least a defined total time within a second predefined detection-time-window. This means, that both signals have to be together logic true for a specific time, which is the defined total time. But it is accepted that the signals are interrupted and continued within the second predefined detection-time-window.

The second predefined detection-time-window has typically the length of the duration of five to ten full waves of the fundamental frequency of the protected electric network. For a 50 Hz network the second predefined detection-time-window typically is in the range of 0.1 s to 0.2 s. The duration of the second predefined detection-time-window is preferably a constant value.

According the preferred embodiment, the defined total time is defined as percentage of the duration of the second predefined detection-time-window. Especially the value of this percentage is not constant. It is set according at least one actual condition.

According to a first embodiment, the duration of the defined total time is set according the presence of humans in a protected area.

According to a second embodiment, the defined total time is a function of the actual root mean square value of the current. Corresponding to this embodiment and FIG. 1, the arc fault detector 1 further comprises a RMS-current-measurement-unit 15, with a fifth output 16 of the RMS-current-measurement-unit 15 being connected to the second controller-unit 12, and that the second controller-unit 12 is adapted to adjust the total time depending on the RMS value of the current. Especially the second controller-unit 12 is adapted to lower the total time for high RMS value of the current, and rise the total time for low RMS value of the current.

The first controller unit 10 and/or the second controller-unit 12 are preferably embodied comprising a microcontroller. Both controller-units 10, 12 can be embodied in just one microcontroller. Further at least two of the signal-pattern-analyzing-unit 4, the slew-rate-detection-unit 6, the frequency-threshold-unit 8 or the RMS-current-measurement-unit 15 can be implemented together in one physical unit, especially comprising a microcontroller. Further all of the units 4, 6, 8, 10, 12, 15 mentioned in this paragraph can be implemented together in just one microcontroller.

Logic true is not a limitation regarding an implementation as a "high" or "positive" signal. Logic false is not a limitation regarding an implementation as a "low" or "negative" or "zero" signal.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An arc fault detector, the arc fault detector comprising:
   a first electric line;
   a first sensor configured to: monitor an electric current or voltage spectrum in the first electric line and output a broadband measurement signal with a bandwidth from at least 10 Hz to 10 MHz;
   a signal-pattern-analyser configured to: compare the broadband measurement signal with at least a first predefined arc pattern, and output a first arc-detection-signal on a first output in a case where the broadband measurement signal matches the arc pattern;
   a slew-rate-detector configured to: determine a slew rate of the electric current in the first electric line, compare the determined slew rate with a threshold slew rate, and output a slew-rate-detection-signal on a second output in a case where the determined slew rate is higher than the threshold slew rate;
   an envelope-step-detector configured to determine a change of an envelope-value of at least a predefined frequency band of the broadband measurement signal within a predefined timespan, the envelope-step-detector comprising:
      an input,
      a band-pass-filter arranged at the input, and
      an envelope determination unit comprising a rectifier coupled to an exit of the band-pass-filter, the envelope determination unit being configured to detect maximum values of a rectified signal and interpolate a curve along the maximum values to build an envelope,
   wherein the envelope-step-detector is further configured to differentiate the envelope and to output an envelope-step-detection-signal on a third output in a case that the determined change is higher than a threshold change;
   a first controller connected to the second output and the third output, the first controller being configured to output a second arc-detection-signal on a fourth output in a case where the first controller receives the slew-rate detection signal and the frequency-detection-signal within a first predefined detection-time-window; and
   a second controller connected to the first output and the fourth output, the second controller being configured to output a trigger signal on a trigger output in a case where the second controller receives the first arc-detection-signal and the second arc-detection-signal for at least a defined total time within a second predefined detection-time-window,
   wherein the electric current and/or voltage in the first electric line are evaluated in parallel in the signal-pattern-analyser, the slew-rate-detector, and the envelope-step-detector.

2. The arc fault detector according to claim 1, wherein the slew-rate-detector is configured to output the slew-rate-detection-signal for a predefined time.

3. The arc fault detector according to claim 1, wherein a central frequency of the band-pass-filter is in the range between 5 MHz and 18 MHz.

4. The arc fault detector according to claim 1, wherein the arc fault detector further comprises a RMS-current-measurement-unit, with a fifth output of the RMS-current-measurement-unit being connected to the second controller, and that the second controller is adapted to adjust the total time depending on the RMS value of the current.

5. The arc fault detector according to claim 1, wherein the arc fault detector further comprises a second sensor adapted for monitoring the electric current in the first line and outputting a low frequency measurement signal, and that the second sensor is connected to the slew-rate-detector.

6. An arc fault circuit breaker, comprising the arc fault detector according to claim 1.

7. The arc fault detector according to claim 2, wherein the predefined time is 1 µs to 500 µs.

8. An arc fault detector, with the arc fault detector comprising:
   a first electric line;
   a first sensor configured to: monitor an electric current or voltage spectrum in the first electric line and output a broadband measurement signal,
   a signal-pattern-analyser configured to: compare the broadband measurement signal with at least a first predefined arc pattern, and output a first arc-detection-signal on a first output in a case where the broadband measurement signal matches the arc pattern;
   a slew-rate-detector configured to: determine a slew rate of the electric current in the first electric line, compare the determined slew rate with a threshold slew rate, and output a slew-rate-detection-signal on a second output in a case where the determined slew rate is higher than the threshold slew rate;
   an envelope-step-detector configured to determine a change of an envelope-value of at least a predefined frequency band of the broadband measurement signal within a predefined timespan, the envelope-step-detector being further configured to output an envelope-step-detection-signal on a third output in a case that the determined change is higher than a threshold change;
   a first controller connected to the second output and the third output, the first controller being configured to output a second arc-detection-signal on a fourth output in a case where the first controller receives the slew-rate detection signal and the frequency-detection-signal within a first predefined detection-time-window; and
   a second controller connected to the first output and the fourth output, the second controller being configured to output a trigger signal on a trigger output in a case where the second controller receives the first arc-detection-signal and the second arc-detection-signal for at least a defined total time within a second predefined detection-time-window,
   wherein the arc fault detector further comprises a RMS-current-measurement-unit, with a fifth output of the RMS-current-measurement-unit being connected to the second controller, and that the second controller is adapted to adjust the total time depending on the RMS value of the current.

9. An arc fault detector, with the arc fault detector comprising:
   a first electric line;
   a first sensor configured to: monitor an electric current or voltage spectrum in the first electric line and output a broadband measurement signal,
   a signal-pattern-analyser configured to: compare the broadband measurement signal with at least a first predefined arc pattern, and output a first arc-detection-signal on a first output in a case where the broadband measurement signal matches the arc pattern;
   a slew-rate-detector configured to: determine a slew rate of the electric current in the first electric line, compare the determined slew rate with a threshold slew rate, and output a slew-rate-detection-signal on a second output in a case where the determined slew rate is higher than the threshold slew rate;
   an envelope-step-detector configured to determine a change of an envelope-value of at least a predefined frequency band of the broadband measurement signal within a predefined timespan, the envelope-step-detector being further configured to output an envelope-step-detection-signal on a third output in a case that the determined change is higher than a threshold change;
   a first controller connected to the second output and the third output, the first controller being configured to output a second arc-detection-signal on a fourth output in a case where the first controller receives the slew-rate detection signal and the frequency-detection-signal within a first predefined detection-time-window; and
   a second controller connected to the first output and the fourth output, the second controller being configured to output a trigger signal on a trigger output in a case where the second controller receives the first arc-detection-signal and the second arc-detection-signal for at least a defined total time within a second predefined detection-time-window,
   wherein the arc fault detector further comprises a second sensor adapted for monitoring the electric current in the first line and outputting a low frequency measurement signal, and that the second sensor is connected to the slew-rate-detector.

* * * * *